(12) United States Patent
Reiss

(10) Patent No.: US 9,893,230 B2
(45) Date of Patent: Feb. 13, 2018

(54) PRODUCING A LIGHTING MODULE

(71) Applicant: OSRAM GmbH, Munich (DE)

(72) Inventor: Martin Reiss, Sinzing (DE)

(73) Assignee: OSRAM GmbH, Munich (DE)

( * ) Notice: Subject to any disclaimer, the term of this patent is extended or adjusted under 35 U.S.C. 154(b) by 0 days.

(21) Appl. No.: 15/058,180

(22) Filed: Mar. 2, 2016

(65) Prior Publication Data

US 2016/0260874 A1   Sep. 8, 2016

(30) Foreign Application Priority Data

Mar. 6, 2015   (DE) .................. 10 2015 204 057

(51) Int. Cl.
*H01L 33/00*   (2010.01)
*H01L 33/56*   (2010.01)

(52) U.S. Cl.
CPC .......... *H01L 33/0095* (2013.01); *H01L 33/56* (2013.01); *H01L 2933/005* (2013.01); *H01L 2933/0058* (2013.01); *H01L 2933/0091* (2013.01)

(58) Field of Classification Search
None
See application file for complete search history.

(56) References Cited

U.S. PATENT DOCUMENTS

| 7,087,463 | B2 * | 8/2006 | Sackrison | ........... | H01L 33/0095 |
| | | | | | 257/E21.599 |
| 2006/0117625 | A1 | 6/2006 | Peterson | | |
| 2007/0262339 | A1 * | 11/2007 | Hussell | ............. | C09K 11/7731 |
| | | | | | 257/99 |
| 2007/0270555 | A1 * | 11/2007 | Jung | ........................ | C08L 83/04 |
| | | | | | 525/478 |
| 2008/0254393 | A1 * | 10/2008 | Chao | ..................... | H01L 33/508 |
| | | | | | 430/321 |
| 2012/0034717 | A1 * | 2/2012 | Colvin | ............... | A61B 5/14532 |
| | | | | | 438/27 |
| 2012/0120644 | A1 | 5/2012 | Rieger | | |
| 2012/0168795 | A1 * | 7/2012 | Liu | ........................ | H01L 33/505 |
| | | | | | 257/98 |

(Continued)

FOREIGN PATENT DOCUMENTS

| DE | 102009035369 A1 | 2/2011 |
| DE | 102010034915 A1 | 2/2012 |

(Continued)

OTHER PUBLICATIONS

German Search Report based on application No. 10 2015 204 057.7(7 pages) dated Nov. 10, 2015 (for reference purpose only).

*Primary Examiner* — Sitaramarao S Yechuri

(74) *Attorney, Agent, or Firm* — Viering, Jentschura & Partner mbB

(57) ABSTRACT

A method for producing a lighting module is provided. The method includes providing a light source substrate populated with at least one semiconductor light source, laterally surrounding the at least one semiconductor light source by a wall, applying at least one prefabricated diffuser element to at least one semiconductor light source, introducing potting compound into the space surrounded by the wall up to a height at which both the at least one semiconductor light source, and potting at least part of the at least one diffuser element.

20 Claims, 3 Drawing Sheets

(56) References Cited

U.S. PATENT DOCUMENTS

| | | | | |
|---|---|---|---|---|
| 2013/0056788 A1* | 3/2013 | Haraguchi | ............ | H01L 33/486 |
| | | | | 257/99 |
| 2013/0277690 A1* | 10/2013 | Ibbetson | ................ | H01L 27/15 |
| | | | | 257/88 |
| 2014/0054619 A1* | 2/2014 | Tseng | ................... | H01L 33/504 |
| | | | | 257/88 |
| 2014/0175478 A1 | 6/2014 | Wirth | | |
| 2014/0203305 A1* | 7/2014 | Kawano | ................ | H01L 33/486 |
| | | | | 257/88 |
| 2016/0079486 A1* | 3/2016 | Sugimoto | ........... | H01L 25/0753 |
| | | | | 257/88 |

FOREIGN PATENT DOCUMENTS

| | | |
|---|---|---|
| DE | 102010043726 A1 | 5/2012 |
| DE | 102013204293 A1 | 9/2014 |
| JP | 2008159435 A | 7/2008 |
| WO | 2012062643 A1 | 5/2012 |
| WO | 2014139735 A1 | 9/2014 |

* cited by examiner

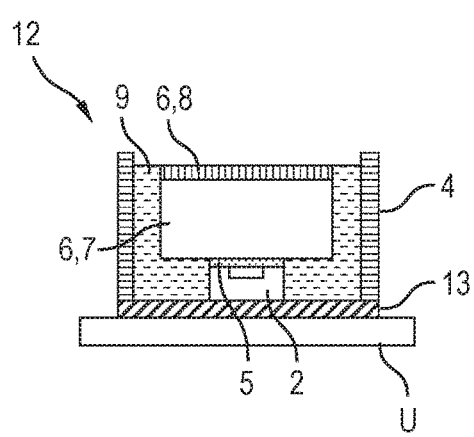
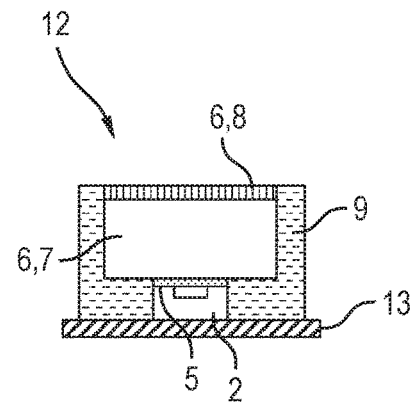
Fig.6    Fig.7
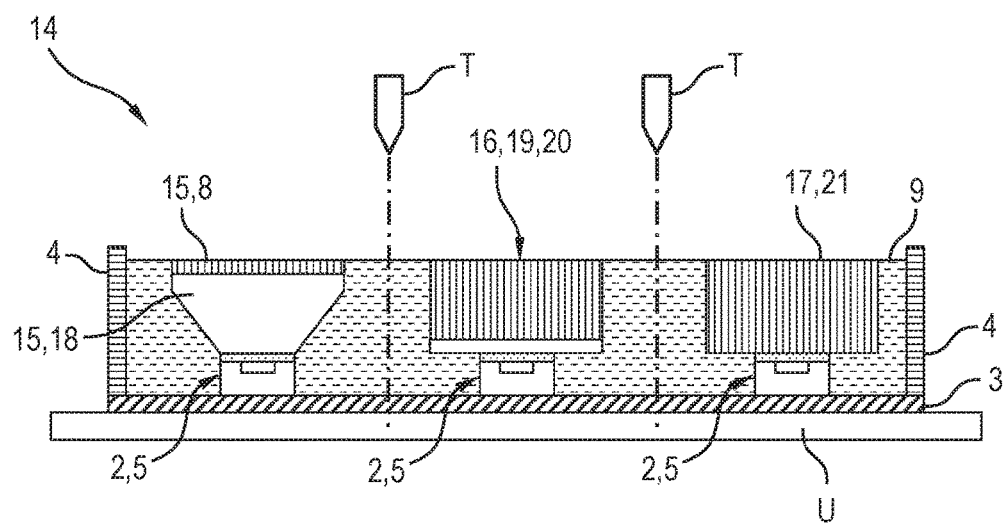
Fig.8

PRODUCING A LIGHTING MODULE

CROSS-REFERENCE TO RELATED APPLICATION

This application claims priority to German Patent Application Serial No. 10 2015 204 057.7, which was filed Mar. 6, 2015, and is incorporated herein by reference in its entirety.

TECHNICAL FIELD

Various embodiments relate generally to a method for producing a lighting module, in which a light source substrate populated with at least one semiconductor light source is provided, the at least one semiconductor light source is laterally surrounded by a wall and at least one diffuser volume is applied to at least one semiconductor light source. Various embodiments also relate generally to a lighting module, having a light source substrate populated with at least one semiconductor light source and having at least one diffuser volume, which is arranged at a light-exiting area of the at least one semiconductor light source, wherein the at least one semiconductor light source and at least part of the diffuser volume are laterally potted with potting compound and wherein the lighting module has been produced by the method. Various embodiments can be applied for example to protected light strips, e.g. LED strips.

BACKGROUND

For producing a protective enclosure of strip-form LED modules, it is known to place LED strips with a strip-form printed circuit board and LEDs arranged in series on the front side thereof into a potting mold of opaque silicone and then to pot them therein. The potting compound may be introduced in multiple layers in the course of a multi-stage potting process, in particular first a transparent potting compound, which surrounds the LEDs, and after that a thin layer of a light-scattering potting compound. With the potting process there is the disadvantage that it is only with difficulty that the thicknesses of the potting compounds can be set precisely, in particular over the LED. It is especially only with difficulty that a thickness of the transparent layer produced by the transparent potting compound can be set precisely. This, however, also has the effect that it is difficult to set a homogeneity and intensity of a luminous flux that is given off outwardly through the potting compounds.

Moreover, such a potting process takes a comparatively long time. In addition, the potting mold can only be produced comparatively laboriously and has to be newly produced for any alteration of a cross-sectional form of the potting compounds. The material costs are also great.

SUMMARY

A method for producing a lighting module is provided. The method includes providing a light source substrate populated with at least one semiconductor light source, laterally surrounding the at least one semiconductor light source by a wall, applying at least one prefabricated diffuser element to at least one semiconductor light source, introducing potting compound into the space surrounded by the wall up to a height at which both the at least one semiconductor light source, and potting at least part of the at least one diffuser element.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 6 shows an intermediate state of production of a second lighting module as a sectional representation in a frontal view;

FIG. 7 shows a finished second lighting module as a sectional representation in a frontal view; and FIG. 8 shows an intermediate state of production of at least one third lighting module as a sectional representation in a frontal view.

DESCRIPTION

Figure 1:
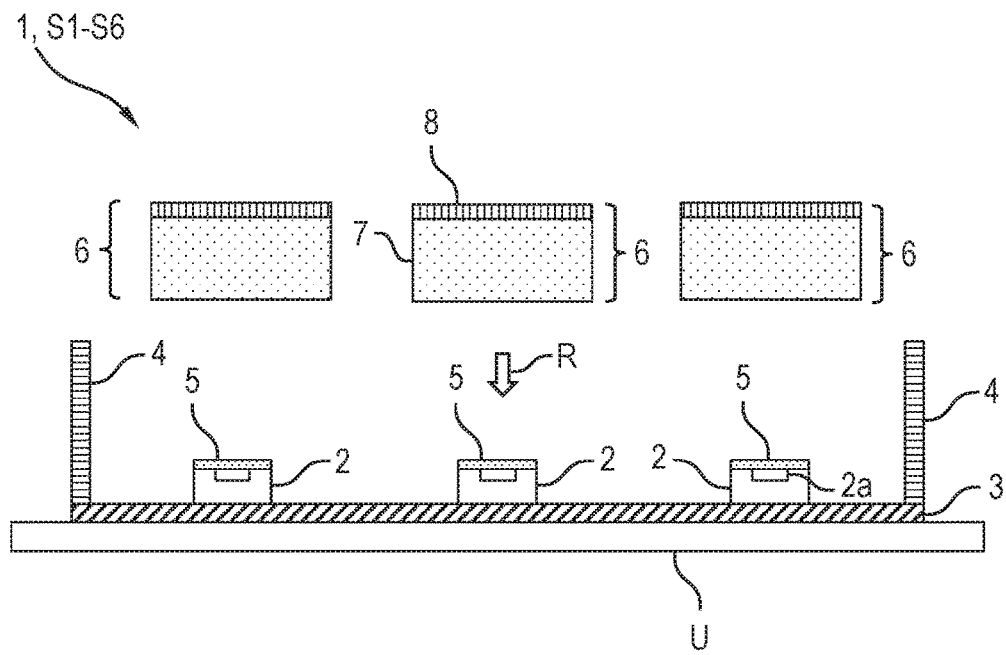
FIG. 1 shows an intermediate state of production of at least one first lighting module as a sectional representation in a frontal view.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Various embodiments may overcome at least partially the disadvantages of the conventional art.

Various embodiments provide a method for producing a lighting module, in which (a) a light source substrate populated with at least one semiconductor light source is provided, (b) the at least one semiconductor light source is laterally surrounded by a wall, (c) at least one prefabricated diffuser element is applied to at least one semiconductor light source, and (d) potting compound is introduced into the space surrounded by the wall up to a height at which both the at least one semiconductor light source and at least part of the at least one diffuser element are potted.

This method may have the effect that no potting mold is necessary to form the diffuser element. This also dispenses with the need for maintenance (for example laborious cleaning) of the potting mold and product-specific tooling costs. Moreover, use of different prefabricated diffuser elements allows rapid type changing (e.g. without changing the wall), so that particularly rapid product modification is therefore also possible, for example. Linear and planar lighting modules (for example two or more lines in parallel) can be produced on the same installation, which makes quicker parallel production processes possible. Filigree structural forms, dependent only on the size of the items with which they are populated (LEDs, components, etc.) can be realized. Lower material costs are also obtained in comparison with straightforward potting processes, for example because in the potting process the transparent layer thickness is very great and requires a large amount of material per product unit. By contrast, the potting compound introduced in the case of the present method need not be introduced so precisely, and can also be produced from a far greater variety of materials—e.g. including lower-cost materials.

The prefabricated diffuser element forms together with the potting compound a protective enclosure (for example against moisture, ESD, foreign bodies, mechanical effects, . . . ) for the populated printed circuit board substrate.

One development is that the lighting module, e.g. its light source substrate, has in addition to the at least one semiconductor light source also at least one electrical and/or electronic component. In various embodiments, if the lighting module, e.g. its light source substrate, has a circuit, it may also be referred to as a "light engine". The circuit may for example be a driver or part of a driver for operating the at least one semiconductor light source.

The at least one semiconductor light source may include at least one light-emitting diode (LED). If there are a number of light-emitting diodes, they may light up in the same color or in different colors. A color may be monochrome (for example red, green, blue, etc.) or multichrome (for example white). The light emitted by the at least one light-emitting diode may also be an infrared light (IR-LED) or an ultraviolet light (UV-LED). A number of light-emitting diodes can produce a mixed light; for example a white mixed light. The at least one light-emitting diode may contain at least one wavelength-converting phosphor (conversion LED). The phosphor may alternatively or additionally be arranged away from the light-emitting diode ("remote phosphor"). The at least one light-emitting diode may take the form of at least one single packaged light-emitting diode or the form of at least one LED chip. A number of LED chips may be mounted on a common substrate ("submount"). The at least one light-emitting diode may be equipped with at least one optical system of its own and/or common optical system for beam guidance, for example at least one Fresnel lens, collimator, and so on. Instead of or in addition to inorganic light-emitting diodes, for example based on InGaN or AlInGaP, organic LEDs (OLEDs, for example polymer OLEDs) can also generally be used. Alternatively, the at least one semiconductor light source may for example include at least one diode laser. There may also be a wavelength-converting phosphor arranged downstream of the at least one diode laser, for example in an LARP ("Laser Activated Remote Phosphor") arrangement.

The form of the light source substrate and the arrangement of the at least one semiconductor light source can in principle be whatever is desired. For instance, the light source substrate may have a basic form that is rectangular, hexagonal, circular, oval or strip-like in plan view.

In particular, the at least one semiconductor light source may be arranged only on the front side of the light source substrate, because a rear side of the light source substrate can then be used as a bearing surface.

One development is that the populated light source substrate is a panel or a PCB cluster, which can be divided into a number of printed circuit boards. This makes particularly easy production possible. Apart from using the method in a panel, it may also be used with already singulated light source substrates (for example with already finished light strips with a strip-form printed circuit board).

The light source substrate may for example include a printed circuit board with an epoxy-resin-based base material (for example FR4), with a ceramic base material (for example aluminum oxide or titanium nitride) or with a base material of plastic. The light source substrate may be rigid or flexible. A form of the light source substrate in plan view on its front side is not restricted, and may for example be of a strip form, rectangular, hexagonal, circular, of a free form, etc. Strip-form light source substrates populated with LED chips are for example obtainable within the product series "LINEARLight" or "PrevaLED" from the Osram company, Germany The lateral wall or walling surrounds the populated light source substrate peripherally. It may for example take the form of a dam or a prefabricated frame. The dam may for example have been produced by dispensing. The wall may be applied to the light source substrate. The wall may alternatively be arranged alongside the light source substrate, and consequently also laterally surround the light source substrate. The wall may be detached for completing the lighting module or may remain (as a whole or at least in pieces) as part of the lighting module.

In the space surrounded by the wall there is the populated light source substrate. The wall has in particular a height that corresponds to a potting height of the potting compound to be introduced thereafter into the space or is higher than the potting height. The wall may have on its inner side facing the populated light source substrate at least one stop edge for precisely reaching the filling height. A form of the wall in plan view is not restricted in principle, and may for example be annular or rectangular.

One development is that the wall consists of silicone or polyurethane, PU.

The prefabrication of the diffuser element allows not only considerably simplified mounting of the lighting module but also less costly and more precise production thereof.

Applying the diffuser element to the at least one semiconductor light source makes easy handling and precise positioning of the diffuser element possible. A risk of bubble formation between the diffuser element and the at least one semiconductor light source is also very low.

One development is that the potting compound is formed as reflective, e.g. diffusely reflective. For this, white pigment, such as titanium oxide powder, aluminum oxide powder, etc., may be added to the potting compound. The reflective form of the potting compound makes a particularly high light yield possible, and a specific outward light emission only through the diffuser element. However, the potting compound may for example also be transparent. The potting compound may also be colored (non-white).

The choice of the (potting) height brings about the effect that the diffuser element is not completely covered by the potting compound, and thus light emitted by the at least one semiconductor light source can be emitted outwardly through the diffuser element even without passing through the potting compound.

One development is that the space surrounded by the wall is potted with the potting compound up to an upper side or up to a side edge of the upper side of the at least one diffuser element. This—e.g. together with a reflective potting compound—has the result that a light emission only through the upper side is made possible. In various embodiments, the potting compound may therefore be introduced into the space surrounded by the wall in such a way that the upper side of the diffuser element is exposed.

Another development is that the potting compound is low-viscosity, e.g. in comparison with a potting compound that is used in the case of conventional methods for potting the LEDs. In one development, the viscosity is about 1 to 1000 mPa·s, e.g. about 10 to 1000 mPa·s. The low viscosity means that the potting compound is self-leveling.

After it has been introduced, the potting compound is cured, e.g. in the panel. The curing may be influenced for example by setting a temperature, atmospheric humidity and/or a time period and/or by irradiating with UV light, etc. The curing is performed e.g. until subsequent handling is possible.

The potting compound may for example include or consist of silicone, polyurethane, polyurethane-polyamide, PU-PA, etc. In various embodiments, such materials (for example two-compound silicone) are thermally very rapidly curing, to be precise starting from a low temperature (from about 100° C.). In the case of two-component polyurethane, for example, the curing may even be based on an exothermic reaction.

One development is that the prefabricated diffuser element is applied to at least one semiconductor light source directly (i.e. without an adhesion promoter or the like). Fastening to the at least one semiconductor light source sufficiently until the introduction of the potting compound may then be achieved already by a tackiness or "stickiness" of the prefabricated diffuser element itself.

One development that is advantageous for particularly strong and/or precisely defined fastening of the prefabricated diffuser element to the at least one semiconductor light source is that the at least one prefabricated diffuser element is adhesively attached to at least one semiconductor light source.

The application of the associated adhesion promoter or bonding agent, e.g. adhesive, may take place for example by dispensing the bonding agent at discrete points onto the surface of the at least one semiconductor light source that serves thereafter as a bearing surface. This may provide the effect that the adhesive bonding process is particularly easy, the bonding agent is only applied where it is required for the bonding and moreover there is a particularly low process risk with regard to bubble formation.

The diffuser element may then be laminated onto the surface of the at least one semiconductor light source covered with the bonding agent. After that, the bonding agent may be fully or partially cured.

One other development is that high-viscosity adhesive is used as the bonding agent, e.g. with a viscosity between about 100 000 mPa·s and 500 000 mPa·s. The adhesive may be for example silicone, PU, PU-PA, etc.

One development is that the adhesive and the diffuser element consist of the same base material, for example of silicone, PU or PU-PA, etc., because in this way a material mismatch can be largely avoided and also virtually no reflective boundary surfaces can occur. Another development that is provided as an alternative or in addition for preventing a material mismatch is that the low-viscosity potting material and the diffuser element consist of the same base material, for example of silicone, PU or PU-PA, etc.

For example, linear or profile-like diffuser elements may be adhesively applied to a respective row of semiconductor light sources. The semiconductor light sources with the associated light source substrates may in this case still be in the panel.

Yet another development is that the diffuser element is an extruded diffuser element. This provides the advantage that the diffuser element can be produced notably less expensively, because extrusion materials are much less expensive than potting materials. The use of an extruded diffuser element also allows the dimensions of the diffuser element over the semiconductor light source, e.g. with regard to a necessary thickness of the transparent region, to be set much more precisely than by way of a potting process. Moreover, a concentration of light-scattering filler (diffuser particles) and also a layer thickness of a transparent region and of a light-scattering region can be easily set. Processing is possible with less effort, including in a panel. The extrusion process may have the possibility of creating complex forms and processing both brittle and soft material. An extruded diffuser element may be an elongate element.

A further development is that the diffuser element is a multi-region body with at least one transparent region and at least one light-scattering region. Such a diffuser element may for example be produced by means of a coextrusion. One development of this is that the transparent region is applied to the at least one semiconductor light source.

Another development is that the potted body is fabricated. Thus, a number of semiconductor modules can be produced in an easy way from a part produced by means of the method. Particularly easy production is obtained by the development that the populated light source substrate is a panel. The fabrication in this case includes in particular a separation of the common light source substrate of the panel. In various embodiments, a number of strip-form lighting modules can be produced.

Various embodiments also provide a lighting module that has been produced by means of the method as described above. The lighting module may be developed in a way analogous to the method and may provide the same effects.

Thus, the lighting module may have a light source substrate, which is populated with at least one semiconductor light source, and at least one diffuser volume, which is arranged at a light-exiting area of the at least one semiconductor light source, wherein the at least one semiconductor light source and at least part of the diffuser volume are laterally potted with potting compound and wherein the at least one diffuser volume represents at least part of a prefabricated diffuser element.

One development is that the lighting module is a protected light strip. It may have at least one strip-form light source substrate (a light strip in the narrower sense) populated with at least one semiconductor light source, onto which one or more diffuser elements have been placed.

FIG. 1 shows an intermediate state of production of at least one first lighting module 1 as a sectional representation in a frontal view.

In this intermediate state, a light source substrate populated on the front side with a number of semiconductor light sources in the form of LEDs 2 has been provided in the form of a printed circuit board 3 in S1. The LEDs 2 have a light-emitting area 2a on the upper side.

The printed circuit board 3 has previously been placed with its rear side onto a level, planar underlay U. It may be held on the underlay U for example by means of suction or by means of a negative pressure.

Moreover, in S2 after providing the printed circuit board 3, a forwardly or upwardly extending, peripherally closed wall 4 has been produced on an edge region of the front side thereof, for example by dispensing silicone or polyurethane. Alternatively, the wall 4 may have been placed onto the printed circuit board 3 as a prefabricated frame.

In addition, in S3, the upper sides of the LEDs 2 with the light-emitting areas 2a have been covered with a high-viscosity adhesion promoter 5, for example with a viscosity between about 100 000 mPa·s and 500 000 mPa·s, for example with silicone, PU, PU-PA, etc.

Moreover, in S4, a number of diffuser elements 6 (here: three) prefabricated by coextrusion have been provided. The diffuser elements 6 are profile-like elements, which are represented in profile in the frontal view. Their longitudinal axis extends perpendicularly in relation to the plane of the image. The profile is rectangular here. The diffuser elements 6 have a rectangular transparent (partial) region 7, facing the LEDs 2, and a layer-like light-scattering (partial) region 8, arranged on the upper side thereof.

Figure 2:
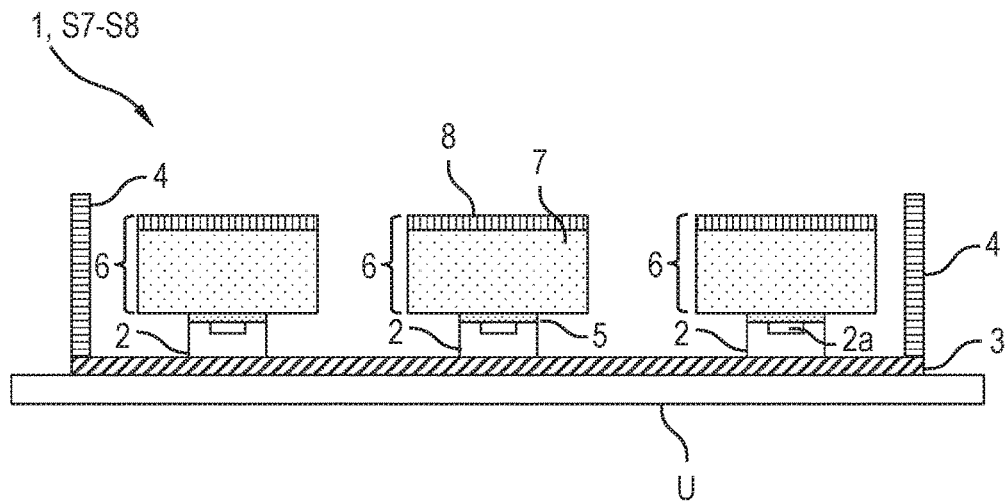
FIG. 2 shows a further intermediate state of the production of the at least one first lighting module as a sectional representation in a frontal view.

In S5, the diffuser elements 6 are placed with their underside onto the upper sides of the LEDs 2 provided with the adhesion promoter 5 and pressed. The state shown in FIG. 2 is thus obtained. The diffuser elements 6 may for example form three rows along their longitudinal axis, lying in each case on a row of a number of—for example equidistantly distributed—LEDs 2.

In a following S6, the adhesion promoter 5 is cured.

Figure 3:
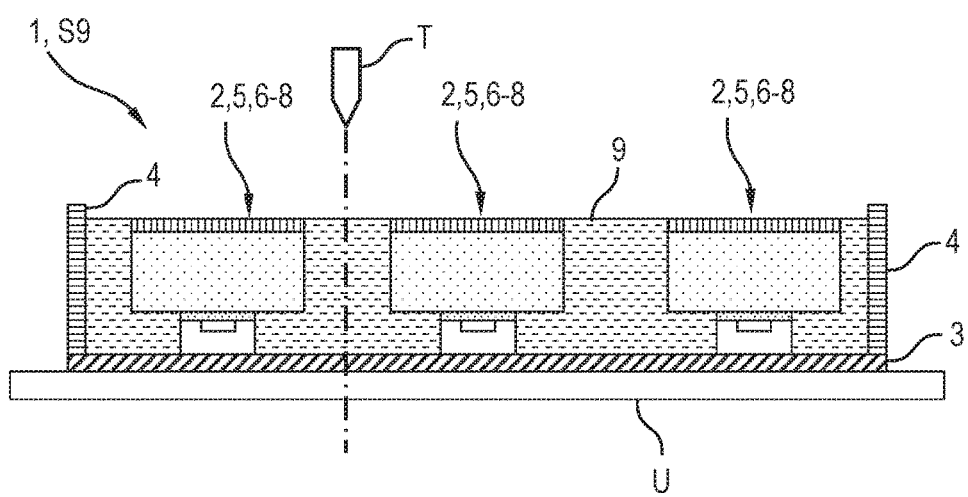
FIG. 3 shows yet a further intermediate state of the production of the at least one first lighting module as a sectional representation in a frontal view.

As shown in FIG. 3, in S7, low-viscosity potting compound 9 with a viscosity in a range of about 10 to 1000 mPa·s is introduced into the mold formed by the wall 4 and the printed circuit board 3, to be precise up to an upper side or up to an upper edge of the diffuser elements 6, without covering their upper side. As a result, the LEDs 2 and the diffuser elements 6 are laterally covered by the potting compound 9. The potting compound 9 here is for example silicone, PU or PU-PA, to which white pigment in the form for example of titanium oxide powder has been added. Therefore, the potting compound 9 is diffusely scattering and prevents a lateral emission of light through it. This brings about the effect of an at least virtually complete light emission through the upper side of the diffuser elements 6. The light emitted by the LEDs 2 is scattered first by the potting compound 9 and further by the light-scattering region 8, whereby a highly homogeneous distribution of the outwardly emitted light is obtained.

Then, in S8, the potting compound 9 is at least partially cured.

This may be followed by a fabricating or singulating process S9. In this, the potted body 2 to 9 may be separated, for example in the form of strips or in strip form parallel to the diffuser elements 6. The separation may be achieved for example by a cutting operation with the aid of separating cutters T. The singulating process S9 may also include detachment of the underlay U and the wall 4.

Figure 4:
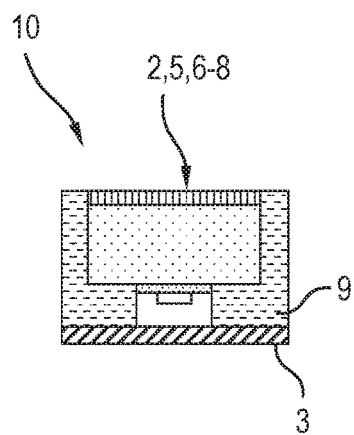
FIG. 4 shows a finished first lighting module as a sectional representation in a frontal view.
Figure 5:
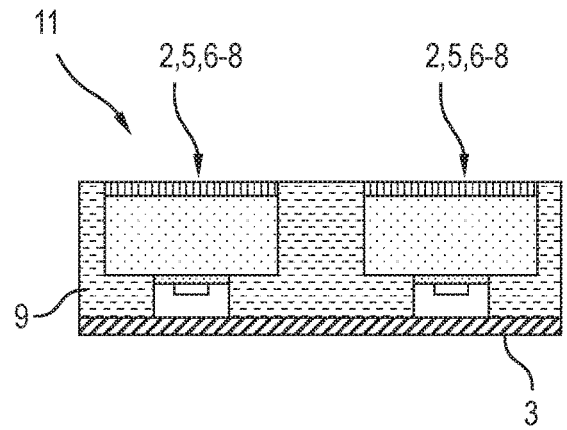
FIG. 5 shows a further finished first lighting module as a sectional representation in a frontal view.

After S9, a number of first lighting modules 10 (FIGS. 4) and 11 (FIG. 5) are obtained. The lighting module 10 is a protected light strip with a diffuser element 6 and a row of LEDs 2. The lighting module 11 is a protected light strip with two parallel-running diffuser elements 6 and two correspondingly parallel-running rows of LEDs 2.

FIG. 6 shows as a sectional representation in a frontal view an intermediate state analogous to FIG. 3 of production of a second lighting module 12, which is shown in FIG. 7. The lighting module 12 and the production thereof differ from the lighting module 1 from FIG. 1 to FIG. 5 in that here only one printed circuit board 13, which is moreover already in its final form, is used and it is not produced in a panel. This makes it possible to dispense with the fabricating step S9. The lighting module 12 can therefore be provided simply by detaching the underlay U and possibly also the wall 4.

FIG. 8 shows as a sectional representation in a frontal view analogous to FIG. 3 an intermediate state of production of at least one third lighting module 14. For this purpose there are here, purely by way of example, three different profile-like diffuser elements 15, 16 and 17.

The diffuser element 15 differs from the diffuser element 6 in that the transparent region 18 now has a cross-sectionally beveled form, so that the potting compound 9 surrounding it has a form that is more effective for light emission.

The diffuser element 16 differs from the diffuser element 6 in that now the transparent region 19 is notably narrower, e.g. also in comparison with the light-scattering region 20. This makes even more effective homogenization of the outwardly emitted light possible.

The diffuser element 17 differs from the diffuser element 6 in that it does not have a transparent region, but only a light-scattering region 21.

As indicated by the separating cutters T, three different lighting modules can be provided by separation, although they have been produced in an identical process sequence.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

Thus, the lighting modules need not be strip-form or in the form of strips.

In general, "a", "one", etc. may be understood as meaning a singular or a plural, in particular in the sense of "at least one" or "one or more", etc., as long as this is not explicitly excluded, for example by the expression "exactly one", etc.

A numerical indication may also include the indicated number exactly and also a customary tolerance range, as long as this is not explicitly excluded.

REFERENCE NUMERALS

1 Lighting module
2 LED
2a Light-emitting area of the LED
3 Printed circuit board
4 Wall
5 Adhesion promoter
6 Diffuser element
7 Transparent region of the diffuser element
8 Light-scattering region of the diffuser element
9 Potting compound
10 Lighting module
11 Lighting module
12 Lighting module
13 Printed circuit board
14 Lighting module
15 Diffuser element
16 Diffuser element
17 Diffuser element
18 Transparent region
19 Transparent region
20 Light-scattering region
21 Light-scattering region S1-S9 Method processes
T Separating cutter
U Underlay

What is claimed is:

1. A method for producing a lighting module, the method comprising:
   providing a light source substrate populated with at least one semiconductor light source;
   laterally surrounding the at least one semiconductor light source by a wall, said wall being independent and detachable from the light source substrate;
   applying at least one prefabricated diffuser element onto each of the at least one semiconductor light sources; and then thereafter
   introducing a potting compound into the space surrounded by the wall, said wall molds the potting compound up to a height at which both the at least one semiconductor light source and at least part of the at least one diffuser element are potted;
   wherein the space surrounded by the wall is potted with the potting compound up to an upper side of the at least one diffuser element.

2. The method of claim 1,
   wherein the potting compound is low-viscosity.

3. The method of claim 2,
   wherein the viscosity of the potting compound lies with a viscosity in a range of about 10 to 1000 mPa·s.

4. The method of claim 1,
   wherein the at least one prefabricated diffuser element is adhesively attached to at least one semiconductor light source.

5. The method of claim 4,
   wherein a high-viscosity adhesive with a viscosity of at least 100,000 mPa·s is used as a bonding agent.

6. The method of claim 1,
   wherein the diffuser element is an extruded diffuser element.

7. The method of claim 1,
   wherein the diffuser element is a multi-region body with at least one transparent region and at least one light-scattering region.

8. The method of claim 7,
   wherein the transparent region is applied to the at least one semiconductor light source.

9. The method of claim 1,
   wherein the potted light source substrate populated with at least one semiconductor light source and diffuser element is fabricated.

10. The method of claim 9,
    wherein the populated light source substrate is a panel.

11. The method of claim 1,
    wherein the potting compound is formed as reflective.

12. The method of claim 11,
    wherein a white pigment is added to the potting compound.

13. A lighting module, comprising:
    a light source substrate, which is populated with at least one semiconductor light source;
    a wall, wherein the wall is independent and detachable from the light source substrate; and
    at least one diffuser volume, which is arranged at a light-exiting area of each of the at least one semiconductor light sources;
    wherein the at least one semiconductor light source and at least part of the at least one diffuser volume are laterally potted with a potting compound up to an upperside of the at least one diffuser volume;
    wherein the potting compound volume is contained within the arrangement of the wall and the at least one diffuser volume;
    wherein the lighting module has been produced by a method, the method comprising:
      providing the light source substrate populated with at least one semiconductor light source;
      laterally surrounding the at least one semiconductor light source by the wall, said wall being independent and detachable from the light source substrate;
      applying at least one prefabricated diffuser element onto each of the at least one semiconductor light sources; and then thereafter
      introducing the potting compound into the space surrounded by the wall, said wall molds the potting compound up to a height at which both the at least one semiconductor light source and at least part of the at least one diffuser element are potted;
      wherein the space surrounded by the wall is potted with the potting compound up to an upper side of the at least one diffuser element; and
    wherein the at least one diffuser volume represents at least part of a prefabricated diffuser element.

14. The lighting module of claim 13,
    wherein the lighting module is a light strip.

15. The lighting module of claim 13, wherein the each of the at least one diffuser element are comprised of differing profile-like diffuser elements.

16. A method for producing a plurality of singular lighting modules, the method comprising:
    providing a light source substrate populated with a plurality of semiconductor light sources;
    laterally surrounding the plurality of semiconductor light sources by a wall, said wall being independent and detachable from the light source substrate;
    applying at least one prefabricated diffuser element onto each of the plurality of semiconductor light sources;
    introducing a potting compound into the space surrounded by the wall, said wall molds the potting compound up to a height at which both the plurality of semiconductor light sources and at least part of the at least one diffuser elements are potted;
    wherein the space surrounded by the wall is potted with the potting compound up to an upper side of the at least one diffuser element; and
    separating the singular lighting modules using at least one separating cutter,
    wherein the separating cutter cuts through the potting compound between the at least two semiconductor light sources.

17. The method according to claim 16, wherein the potting compound is separated in the form of strips parallel to the at least one diffuser element.

18. The method according to claim 16, further comprising detaching the light source substrate and the wall using the detachable feature of said wall.

19. The method according to claim 16, wherein the singular lighting module is a light strip comprised of a plurality of semiconductor light sources.

20. The method according to claim 16, wherein the singular lighting module is comprised of a single semiconductor light source.

* * * * *